US010100156B2

(12) United States Patent
Kim et al.

(10) Patent No.: US 10,100,156 B2
(45) Date of Patent: Oct. 16, 2018

(54) CURABLE RESIN COMPOSITION

(71) Applicant: The Yokohama Rubber Co., LTD., Minato-ku, Tokyo (JP)

(72) Inventors: Emi Kim, Hiratsuka (JP); Yoshihito Takei, Hiratsuka (JP); Motoki Takuma, Hiratsuka (JP); Takeaki Saiki, Hiratsuka (JP)

(73) Assignee: The Yokohama Rubber Co., LTD. (JP)

( * ) Notice: Subject to any disclaimer, the term of this patent is extended or adjusted under 35 U.S.C. 154(b) by 74 days.

(21) Appl. No.: 15/125,541

(22) PCT Filed: Dec. 25, 2014

(86) PCT No.: PCT/JP2014/084365
§ 371 (c)(1),
(2) Date: Sep. 12, 2016

(87) PCT Pub. No.: WO2015/136820
PCT Pub. Date: Sep. 17, 2015

(65) Prior Publication Data
US 2017/0002149 A1    Jan. 5, 2017

(30) Foreign Application Priority Data

Mar. 12, 2014 (JP) .................................. 2014-049127

(51) Int. Cl.
*C08L 83/04* (2006.01)
*H01L 23/29* (2006.01)
*C08G 77/00* (2006.01)
*H01L 33/56* (2010.01)
*C09J 183/04* (2006.01)
*C08G 77/12* (2006.01)
*C08G 77/20* (2006.01)

(52) U.S. Cl.
CPC .............. *C08G 77/80* (2013.01); *C08L 83/04* (2013.01); *C09J 183/04* (2013.01); *H01L 23/296* (2013.01); *H01L 33/56* (2013.01); *C08G 77/12* (2013.01); *C08G 77/20* (2013.01); *C08G 2190/00* (2013.01)

(58) Field of Classification Search
CPC ............................. H01L 33/56; H01L 23/296
USPC .................................................. 257/788, 791
See application file for complete search history.

(56) References Cited

U.S. PATENT DOCUMENTS

| | | | |
|---|---|---|---|
| 8,519,429 B2 * | 8/2013 | Tanikawa ............. | C09K 3/1018 257/100 |
| 9,117,757 B2 * | 8/2015 | Malhotra ................ | C08L 83/04 |
| 2008/0015326 A1 | 1/2008 | Kodama et al. | |
| 2010/0213502 A1 * | 8/2010 | Kashiwagi ............. | C08G 77/20 257/100 |
| 2011/0251356 A1 | 10/2011 | Sagawa et al. | |
| 2011/0254047 A1 * | 10/2011 | Yoshitake ............... | C08L 83/04 257/100 |
| 2013/0221400 A1 * | 8/2013 | Tanikawa .............. | H01L 23/296 257/99 |
| 2013/0274398 A1 | 10/2013 | Shiobara et al. | |
| 2013/0306137 A1 * | 11/2013 | Ko ..................... | H01L 31/0481 136/246 |
| 2014/0174523 A1 * | 6/2014 | Ko ....................... | C09D 183/04 136/256 |
| 2015/0252191 A1 * | 9/2015 | Kim ........................ | C08L 83/04 525/478 |
| 2015/0344692 A1 * | 12/2015 | Nishijima .............. | C08G 77/14 525/478 |
| 2016/0194457 A1 | 7/2016 | Takei et al. | |
| 2017/0253700 A1 * | 9/2017 | Dogen ................... | C08G 77/04 |

FOREIGN PATENT DOCUMENTS

| | | |
|---|---|---|
| EP | 1 878 768 | 1/2008 |
| EP | 2 896 658 | 7/2015 |
| EP | 3 020 765 | 5/2016 |
| JP | H11-01619 | 1/1999 |
| JP | 2008-019385 | 1/2008 |
| JP | 2010-001336 | 1/2010 |
| JP | 2011-190366 | 9/2011 |
| JP | 2011-246680 | 12/2011 |
| JP | 2012-507582 | 3/2012 |
| JP | 2013-139547 | 7/2013 |
| JP | 2013-231160 | 11/2013 |
| WO | WO 2009/154261 | 12/2009 |
| WO | WO 2010/027105 | * 3/2010 |
| WO | WO 2010/050625 | 5/2010 |
| WO | WO 2014/041994 | 3/2014 |
| WO | WO 2015/019705 | 2/2015 |

OTHER PUBLICATIONS

Machine translation of JP 2008-019385.*
International Search Report for International Application No. PCT/JP2014/084365 dated Apr. 14, 2015, 4 pages, Japan.

* cited by examiner

Primary Examiner — Marc S Zimmer
(74) Attorney, Agent, or Firm — Thorpe North & Western

(57) ABSTRACT

The curable resin composition of the present technology includes: (A) a straight-chain organopolysiloxane having at least two silicon-bonded hydrogen atoms and at least one aryl group in one molecule and having an average degree of polymerization of greater than 10; (B) a branched-chain organopolysiloxane having at least three alkenyl groups and at least one aryl group in one molecule; and (C) a hydrosilylation reaction catalyst; wherein a proportion of diphenylsiloxane units relative to an amount of all siloxane units is 10 mol % or greater, and the all siloxane units containing siloxane units derived from the straight-chain organopolysiloxane (A) and the branched-chain organopolysiloxane (B).

8 Claims, No Drawings

CURABLE RESIN COMPOSITION

TECHNICAL FIELD

The present technology relates to a curable resin composition.

BACKGROUND ART

Curable resin compositions containing silicone resins have been known conventionally and are used, for example, as compositions for sealing optical semiconductors.

For example, Japanese Unexamined Patent Application Publication No. 2010-001336A describes "a curable organopolysiloxane composition comprising at least: (A) a branched-chain organopolysiloxane which contains in one molecule at least three alkenyl groups and in which at least 30 mol % of all silicon-bonded organic groups is aryl groups; (B) a straight-chain organopolysiloxane that contains an aryl group and that has both molecular terminals capped with diorganohydrogensiloxy groups (in an amount so that the amount of the silicon-bonded hydrogen atoms contained in the component (B) per 1 mol of the alkenyl groups contained in the component (A) is from 0.5 to 2 mol); (C) a branched-chain organopolysiloxane that contains in one molecule at least three diorganohydrogensiloxy groups and at least 15 mol % of all silicon-bonded organic groups is aryl groups (in an amount so that the amount of the diorganohydrogensiloxy groups contained in the component (C) is from 1 to 20 mol % relative to the total amount of the diorganohydrogensiloxy groups contained in the component (B) and in the component (C); and (D) a hydrosilylation catalyst (in an amount that accelerates curing of the composition)" ([Claim 1]).

Furthermore, in Working Examples 1 and 3 described in the "Examples" section of Japanese Unexamined Patent Application Publication No. 2010-001336A, a substance with a degree of polymerization of 1 is used as the (B) straight-chain organopolysiloxane having an aryl group and having both molecular terminals capped with diorganohydrogensiloxy groups.

Furthermore, Japanese Unexamined Patent Application Publication (translation of PCT application) No. 2012-507582A describes "a hydrosilylation reaction-curable organopolysiloxane composition comprising: (A) a methylphenylalkenylpolysiloxane that has at least two silicon-bonded alkenyl groups in one molecule, wherein 5 mol % or less of all siloxane units is diphenylsiloxane units and at least 20 mol % of all silicon-bonded organic groups in the molecule is phenyl groups, (B) a methylphenylhydrogenpolysiloxane that has at least two silicon-bonded hydrogen atoms in one molecule, wherein 5 mol % or less of all siloxane units is diphenylsiloxane units and at least 20 mol % of all silicon-bonded organic groups in the molecule is phenyl groups, and (C) a hydrosilylation reaction catalyst; wherein an amount of the diphenylsiloxane units in this composition is 5 mol % or less of the amount of all siloxane units" ([Claim 1]).

In recent years, the performance level required for curable resin compositions containing silicone resins has increased, and there is a demand for better adhesion to adherends, in particular.

When investigating the "curable organopolysiloxane composition" disclosed in Japanese Unexamined Patent Application Publication Nos. 2010-001336A and 2012-507582A, the inventors of the present technology found that the adhesion of the cured product is insufficient depending on the type of the adherend and environment after the curing.

The present technology provides a curable resin composition having excellent adhesion to adherends.

Use of a curable resin composition containing a straight-chain organopolysiloxane having a predetermined functional group and an average degree of polymerization of greater than 10, and a branched-chain organopolysiloxane having a predetermined functional group, the curable resin composition having a proportion of diphenylsiloxane units relative to an amount of all siloxane units of 10 mol % or greater, leads to excellent adhesion to various adherends, according to the present technology.

Specifically, the present may be described by the following features.

[1] A curable resin composition comprising:
(A) a straight-chain organopolysiloxane having at least two silicon-bonded hydrogen atoms and at least one aryl group in one molecule and having an average degree of polymerization of greater than 10;
(B) a branched-chain organopolysiloxane having at least three alkenyl groups and at least one aryl group in one molecule; and
(C) a hydrosilylation reaction catalyst;
wherein a proportion of diphenylsiloxane units relative to an amount of all siloxane units is 10 mol % or greater, and the all siloxane units containing siloxane units derived from the straight-chain organopolysiloxane (A) and the branched-chain organopolysiloxane (B).

[2] The curable resin composition according to [1], where a total content of a cyclic organosiloxane having a molecular weight of 150 to 1,200 is 7.5 mass % or less.

[3] The curable resin composition according to [1] or [2], where the average degree of polymerization of the straight-chain organopolysiloxane (A) is greater than 30.

[4] The curable resin composition according to any one of [1] to [3], where the branched-chain organopolysiloxane (B) is an organopolysiloxane represented by average unit formula (4) below:

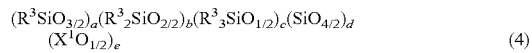

$$(R^3SiO_{3/2})_a(R^3{}_2SiO_{2/2})_b(R^3{}_3SiO_{1/2})_c(SiO_{4/2})_d(X^1O_{1/2})_e \quad (4)$$

In Formula (4), each $R^3$ moiety is independently a substituted or unsubstituted monovalent hydrocarbon group; however, in one molecule, at least three of the $R^3$ moieties are alkenyl groups, and at least one $R^3$ moiety is an aryl group.

In Formula (4), $X^1$ is a hydrogen atom or alkyl group. In Formula (4), a is a positive number; b is 0 or a positive number; c is 0 or a positive number; d is 0 or a positive number; e is 0 or a positive number; b/a is a number in a range of 0 to 10; c/a is a number in a range of 0 to 0.50; d/(a+b+c+d) is a number in a range of 0 to 0.3; and e/(a+b+c+d) is a number in a range of 0 to 0.4.

[5] The curable resin composition according to any one of [1] to [4], further comprising a straight-chain organopolysiloxane (G) represented by Formula (6) below:

$$HR^2{}_2SiO(R^2{}_2SiO)_kSiR^2{}_2H \quad (6)$$

In Formula (6), each $R^2$ moiety is independently an alkyl group, aryl group, hydroxy group, or alkoxy group, and at least one of the $R^2$ moieties is an aryl group.

In Formula (6), k is a positive number of 1 to 5.

The curable resin composition according to any one of [1] to [5], where the composition is a composition for sealing an optical semiconductor element.

With the present technology, a curable resin composition having excellent adhesion to adherends can be provided.

DETAILED DESCRIPTION

The present technology is explained in detail below.

Although the components described below may be described based on representative embodiments of the present technology, the present technology is not limited to such embodiments.

Note that, in the present specification, numerical ranges indicated using "(from) . . . to . . . " include the former number as the lower limit value and the later number as the upper limit value.

The curable resin composition of the present technology (hereinafter, also referred to as "composition of the present technology") is a curable resin composition comprising: (A) a straight-chain organopolysiloxane having at least two silicon-bonded hydrogen atoms and at least one aryl group in one molecule and having an average degree of polymerization of greater than 10; (B) a branched-chain organopolysiloxane having at least three alkenyl groups and at least one aryl group in one molecule; and (C) a hydrosilylation reaction catalyst; wherein a proportion of diphenylsiloxane units relative to an amount of all siloxane units is 10 mol % or greater, and the all siloxane units containing siloxane units derived from the straight-chain organopolysiloxane (A) and the branched-chain organopolysiloxane (B).

Herein, "all siloxane units" refers to siloxane units in the straight-chain organopolysiloxane (A) and the branched-chain organopolysiloxane (B); however, when a low-viscosity organopolysiloxane (D) and a straight-chain organopolysiloxane (G), which are optional components, are contained, the "all siloxane units" also contains siloxane units of these components.

In the present technology, by allowing the straight-chain organopolysiloxane (A), the branched-chain organopolysiloxane (B), and the hydrosilylation reaction catalyst (C) to be contained and by setting the proportion of the diphenylsiloxane units relative to the amount of all the siloxane units to be 10 mol % or greater, excellent adhesion of the cured product to adherends can be achieved.

The details are not entirely clear, however, the following reasons are conceivable.

That is, it is conceived that toughness is imparted to the cured product due to the average degree of polymerization of the straight-chain organopolysiloxane (A) being greater than 10, and π-π interactions occur due to the proportion of the diphenylsiloxane units relative to the amount of all the siloxane units being 10 mol % or greater, thereby imparting the toughness and the adhesive properties to the cured product.

Each component contained in the composition of the present technology will be described in detail hereinafter.

Straight-chain Organopolysiloxane (A)

The straight-chain organopolysiloxane (A) is a straight-chain organopolysiloxane having at least two silicon-bonded hydrogen atoms and at least one aryl group in one molecule, and the average degree of polymerization thereof is greater than 10.

The straight-chain organopolysiloxane (A) is subjected to an addition reaction (hydrosilylation reaction) with respect to the alkenyl groups of the branched-chain organopolysiloxane (B) described below. At this time, since the straight-chain organopolysiloxane (A) has at least two silicon-bonded hydrogen atoms (Si—H), it can function as a crosslinking agent for the branched-chain organopolysiloxane (B).

From the perspective of demonstrating superior adhesion in the cured product and better handleability, the average degree of polymerization of the straight-chain organopolysiloxane (A) is preferably greater than 30, more preferably greater than 30 and at most 1,000, and even more preferably greater than 30 and at most 500.

In this specification, the average degree of polymerization of the straight-chain organopolysiloxane is equivalent to a value determined by subtracting the number of the two silicon atoms on both terminals from the number of silicon atoms in the straight-chain organopolysiloxane.

For example, when the straight-chain organopolysiloxane (A) is an organopolysiloxane represented by Formula (1) described below, the average degree of polymerization is a value expressed by n in Formula (1).

Furthermore, the average degree of polymerization of the straight-chain organopolysiloxane (G) represented by Formula (6) described below is a value expressed by k in Formula (6).

Furthermore, in order to ensure that the resulting cured product has low attenuation due to the diffraction, reflection, scattering, or the like of light, the straight-chain organopolysiloxane (A) has at least one aryl group, and it is preferable for at least 30 mol % and more preferable for at least 40 mol % of all of the silicon-bonded organic groups to be aryl groups.

Examples of these aryl groups include aryl groups having from 6 to 18 carbons such as phenyl groups, tolyl groups, and xylyl groups, and phenyl groups are preferable.

Examples of groups binding to the silicon atoms in the straight-chain organopolysiloxane (A) include substituted or unsubstituted monovalent hydrocarbon groups not having aliphatic unsaturated groups, and specific examples include alkyl groups having from 1 to 18 carbons such as methyl groups, ethyl groups, n-propyl groups, isopropyl groups, n-butyl groups, isobutyl groups, sec-butyl groups, tert-butyl groups, various pentyl groups, various hexyl groups, various octyl groups, various decyl groups, cyclopentyl groups, and cyclohexyl groups; aryl groups having from 6 to 18 carbons such as phenyl groups, tolyl groups, and xylyl groups; aralkyl groups having from 7 to 18 carbons such as benzyl groups and phenethyl groups; and halogenated alkyl groups having from 1 to 18 carbons such as 3-chloropropyl groups and 3,3,3-trifluoropropyl groups.

In the present technology, from the perspective of achieving toughness of the cured product, the number of the silicon-bonded hydrogen atoms contained in the straight-chain organopolysiloxane (A) is preferably two, and an aspect where the silicon-bonded hydrogen atoms are positioned only at both molecular terminals is more preferable.

Such a straight-chain organopolysiloxane (A) is preferably a straight-chain organopolysiloxane having both molecular terminals capped with diorganohydrogensiloxy groups, an example of which is an organopolysiloxane represented by the following Formula (1).

$$HR^1_2SiO(R^1_2SiO)_n SiR^1_2H \qquad (1)$$

In Formula (1), each $R^1$ moiety is independently a substituted or unsubstituted monovalent hydrocarbon group not having aliphatic unsaturated bonds. Examples of the monovalent hydrocarbon group of $R^1$ include alkyl groups having from 1 to 18 carbons such as methyl groups, ethyl groups, n-propyl groups, isopropyl groups, n-butyl groups, isobutyl groups, sec-butyl groups, tert-butyl groups, various pentyl groups, various hexyl groups, various octyl groups, various decyl groups, cyclopentyl groups, and cyclohexyl groups; aryl groups having from 6 to 18 carbons such as phenyl groups, tolyl groups, and xylyl groups; aralkyl groups having from 7 to 18 carbons such as benzyl groups and phenethyl groups; and halogenated alkyl groups having from 1 to 18 carbons such as 3-chloropropyl groups and 3,3,3-trifluoropropyl groups. Of these, alkyl groups having from 1 to 18 carbons are preferable, and methyl groups (sometimes referred to as "Me" hereafter) are more preferable.

It is also preferable for least one $R^1$ moiety to be an aryl group and for at least 30 mol % to be aryl groups, and it is more preferable for at least 40 mol % to be aryl groups. The aryl groups are aryl groups having from 6 to 18 carbons and are preferably phenyl groups (sometimes referred to as "Ph" hereafter).

In Formula (1), n is a positive number with an average value greater than 10; positive numbers greater than 30 are preferable; positive numbers greater than 30 and at most 1,000 are more preferable; and positive numbers greater than 30 and at most 500 are even more preferable. When n is a positive number of 10 or lower, the adhesion of the cured product is diminished, whereas when n is within the ranges described above, the adhesion of the cured product is excellent.

Because toughness tends to be exhibited by the cured product, the weight average molecular weight (Mw) of the straight-chain organopolysiloxane (A) is preferably from 500 to 1,000,000 and more preferably from 1,000 to 150,000.

In the present technology, the weight average molecular weight is the weight average molecular weight indicated by the molecular weight of polystyrene as determined by gel permeation chromatography (GPC) using chloroform as a solvent.

In addition, the viscosity of the straight-chain organopolysiloxane (A) at 25° C. is preferably from 20 to 1,000,000 mPa·s and more preferably from 200 to 100,000 mPa·s.

Note that, in the present technology, viscosity is measured at 25° C. in accordance with section 4.1 (Brookfield rotational viscometer) of JIS K7117-1.

Method of Producing Straight-chain Organopolysiloxane (A) (Method 1)

The method of producing the straight-chain organopolysiloxane (A) is not particularly limited, and an example is a method of obtaining the straight-chain organopolysiloxane (A) described above as a main product by reacting an organopolysiloxane (a1) having two or more silanol groups in one molecule and a disiloxane (a2) having silicon-bonded hydrogen atoms, adding water ($H_2O$) as a by-product, and optionally performing dehydration condensation on the silanol groups remaining after the reaction.

At this time, the reaction may be ended after obtaining a reaction product containing the straight-chain organopolysiloxane (A) as a main product and by-products by performing reaction tracking by with $^1$H-NMR and confirming the disappearance of peaks originating from the silanol groups of the organopolysiloxane (a1) or the appearance of peaks originating from components other than the components used in the reaction.

An example of the organopolysiloxane (a1) used in the reaction described above is an organopolysiloxane represented by the following Formula (2), and an example of the disiloxane (a2) is a disiloxane represented by the following Formula (3).

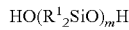  (2)

  (3)

In Formulas (2) and (3), $R^1$ is synonymous with $R^1$ described above. In addition, in Formula (2), m is a positive number equal to or less than n described above.

In the production method described above, some of the silanol groups of the organopolysiloxane (a1) of Formula (2), for example, are capped with —$SiR^1_2H$ derived from the disiloxane (a2) of Formula (3), and the remaining silanol groups are condensed and thereby polymerized. Therefore, the average degree of polymerization of the straight-chain organopolysiloxane (A) depends on the charged amount of the disiloxane (a2).

The reaction described above is preferably performed by stirring. At the time of stirring, it is preferable to heat the mixture within a temperature range of 50 to 65° C., for example, and the stirring time (reaction time) is preferably from 1 to 5 hours, for example.

Method of Producing Straight-chain Organopolysiloxane (A) (Method 2)

An example of another method of producing the straight-chain organopolysiloxane (A) is a production method comprising heating a cyclic methylphenylsiloxane oligomer in the presence of a molecular chain terminal capping agent (e.g., 1,1,3,3-tetramethyldisiloxane) and a polymerization catalyst (e.g., potassium hydroxide, potassium dimethylsiloxanolate, tetramethylammonium hydroxide, or tetramethylammonium dimethylsiloxanolate) to perform equilibrium polymerization, neutralizing or pyrolyzing the polymerization catalyst, and then removing cyclic organosiloxanes which are possibly generated as byproducts as described below (e.g., 1,3,5-trimethyl-1,3,5-triphenylcyclotrisiloxane and 1,3,5,7-tetramethyl-1,3,5,7-cyclotetraphenylcyclotetrasiloxane) by heating under reduced pressure.

Cyclic Organosiloxane

From the perspective of achieving even better adhesion to adherends, the composition of the present technology preferably has a total content of the cyclic organosiloxanes having a molecular weight of 150 to 1,200 of 7.5 mass % or less, and the composition of the present technology more preferably contains substantially no cyclic organosiloxanes having a molecular weight of 150 to 1,200. Therefore, the method of producing the straight-chain organopolysiloxane (A) is preferably the method of producing the straight-chain organopolysiloxane (A) (Method 1) described above.

Examples of the cyclic organosiloxane include a compound represented by Formula (I) below.

  (I)

In Formula (I), each $R^1$ is independently a substituted or unsubstituted monovalent hydrocarbon group having no aliphatic unsaturated bond and is synonymous with $R^1$ in Formula (I) described above, and at least one of the $R^1$ moieties is an aryl group.

Furthermore, in Formula (I), p is an integer of 3 to 6.

Examples of the compound represented by Formula (I) include 1,3,5-trimethyl-1,3,5-triphenylcyclotrisiloxane, 1,3,5,7-tetramethyl-1,3,5,7-tetraphenylcyclotrisiloxane, and the like.

Branched-chain Organopolysiloxane (B)

The branched-chain organopolysiloxane (B) is a branched-chain organopolysiloxane having at least three alkenyl groups and at least one aryl group in one molecule.

Examples of these alkenyl groups include alkenyl groups having from 2 to 18 carbons such as vinyl groups, allyl groups, butenyl groups, pentenyl groups, hexenyl groups, and octenyl groups, and vinyl groups (sometimes referred to as "Vi" hereafter) are preferable.

The amount of alkenyl groups in one molecule is preferably from 2 to 12 mass %, and more preferably from 3 to 10 mass %.

In addition, the branched-chain organopolysiloxane (B) preferably has at least one aryl group, and it is preferable for at least 30 mol % and more preferable for at least 40 mol % of all of the silicon-bonded organic groups to be aryl groups.

Examples of these aryl groups include aryl groups having from 6 to 18 carbons such as phenyl groups, tolyl groups, and xylyl groups, and phenyl groups are preferable.

As a result, not only does the resulting cured product have low attenuation due to the diffraction, reflection, scattering, or the like of light, but the substance has excellent compatibility with the straight-chain organopolysiloxane (A), which similarly has aryl groups, reduced turbidity or the like, and excellent transparency of the cured product.

Examples of other groups binding to silicon atoms in the branched-chain organopolysiloxane (B) include substituted or unsubstituted monovalent hydrocarbon groups excluding alkenyl groups and aryl groups, and specific examples include alkyl groups having from 1 to 18 carbons such as methyl groups, ethyl groups, n-propyl groups, isopropyl groups, n-butyl groups, isobutyl groups, sec-butyl groups, tert-butyl groups, various pentyl groups, various hexyl groups, various octyl groups, various decyl groups, cyclopentyl groups, and cyclohexyl groups; aralkyl groups having from 7 to 18 carbons such as benzyl groups and phenethyl groups; and halogenated alkyl groups having from 1 to 18 carbons such as 3-chloropropyl groups and 3,3,3-trifluoropropyl groups. The substance may also contain small amounts of other groups such as silicon-bonded hydroxyl groups or silicon-bonded alkoxy groups. Examples of these alkoxy groups include methoxy groups, ethoxy groups, propoxy groups, butoxy groups, and the like.

Such a branched-chain organopolysiloxane (B) is preferably an organopolysiloxane represented by the following average unit formula (4).

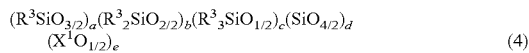

(4)

In Formula (4), each $R^3$ moiety is independently a substituted or unsubstituted monovalent hydrocarbon group. Examples of this monovalent hydrocarbon group include alkyl groups having from 1 to 18 carbons such as a methyl group, ethyl group, n-propyl group, isopropyl group, n-butyl group, isobutyl group, sec-butyl group, tert-butyl group, various pentyl groups, various hexyl groups, various octyl groups, various decyl groups, cyclopentyl group, and cyclohexyl group; alkenyl groups having from 2 to 18 carbons such as a vinyl group, allyl group, butenyl group, pentenyl group, hexenyl group, and octenyl group; aryl groups having from 6 to 18 carbons such as a phenyl group, tolyl group, and xylyl group; aralkyl groups having from 7 to 18 carbons such as a benzyl group and phenethyl group; and halogenated alkyl groups having from 1 to 18 carbons such as a 3-chloropropyl group and 3,3,3-trifluoropropyl group.

However, it is preferable for at least three of the $R^3$ moieties in one molecule to be alkenyl groups and for the amount of $R^3$ in the form of alkenyl groups to be from 2 to 12 mass %, and the amount is more preferably from 3 to 10 mass %.

In addition, it is also preferable for at least one $R^3$ moiety in one molecule to be an aryl group and for at least 30 mol % of all of the $R^3$ moieties to be aryl groups, and it is more preferable for at least 40 mol % to be aryl groups.

In Formula (4), $X^1$ is a hydrogen atom or an alkyl group. Examples of this alkyl group include alkyl groups having from 1 to 18 carbons such as methyl groups, ethyl groups, n-propyl groups, isopropyl groups, n-butyl groups, isobutyl groups, sec-butyl groups, tert-butyl groups, various pentyl groups, various hexyl groups, various octyl groups, various decyl groups, cyclopentyl groups, and cyclohexyl groups, and methyl groups are preferable.

In Formula (4), a is a positive number; b is 0 or a positive number; c is 0 or a positive number; d is 0 or a positive number; e is 0 or a positive number; b/a is a number in a range of 0 to 10; c/a is a number in a range of 0 to 0.50; d/(a+b+c+d) is a number in a range of 0 to 0.3; and e/(a+b+c+d) is a number in a range of 0 to 0.4.

The weight average molecular weight (Mw) of the branched-chain organopolysiloxane (B) is preferably from 1,000 to 300,000 and more preferably from 1,000 to 100,000.

Furthermore, the branched-chain organopolysiloxane (B) is an extremely viscous semi-solid material or a solid material, and it is difficult to measure the viscosity thereof. Therefore, unlike the low-viscosity organopolysiloxane (D) described below, it is also difficult to measure the viscosity at 25° C. in accordance with section 4.1 (Brookfield rotational viscometer) of JIS (Japanese Industrial Standard) K7117-1.

The content of the branched-chain organopolysiloxane (B) is preferably an amount at which the molar ratio of the silicon-bonded hydrogen atoms of the straight-chain organopolysiloxane (A) having silicon-bonded hydrogen atoms (when the composition of the present technology also contains an organopolysiloxane having silicon-bonded hydrogen atoms (for example, a straight-chain organopolysiloxane (G) described below), this organopolysiloxane is also included; this is the same hereinafter) to the alkenyl groups of the branched-chain organopolysiloxane (B) (hereinafter, also referred to as "Si—H/Si-Vi molar ratio" for convenience) satisfies a range of 0.5 to 5.0, more preferably a range of 0.5 to 2.0, and even more preferably a range of 0.5 to 1.5.

When the Si—H/Si-Vi molar ratio is within this range, the curability of the composition of the present technology is excellent, and the adhesion of the cured product is also superior.

Hydrosilylation Reaction Catalyst (C)

The hydrosilylation reaction catalyst (C) contained in the composition of the present technology is used in combination with the straight-chain organopolysiloxane (A) and functions as a catalyst for accelerating the addition reaction (hydrosilylation reaction) with respect to the alkenyl groups of the branched-chain organopolysiloxane (B).

A conventionally known catalyst can be used as the hydrosilylation reaction catalyst (C). Examples include platinum catalysts, rhodium catalysts, and palladium catalysts, and platinum catalysts are preferable. Specific examples of platinum catalysts include chloroplatinic acid, chloroplatinic acid-olefin complexes, chloroplatinic acid-divinyltetramethyldisiloxane complexes, chloroplatinic acid-alcohol coordination compounds, diketone complexes of platinum, platinum divinyltetramethyldisiloxane complexes, and the like. One type of these may be used alone or two or more types of these may be used in combination.

The content of the hydrosilylation reaction catalyst (C) is a catalytic amount, but from the perspective of ensuring the excellent curability of the composition of the present technology, the content is preferably from 0.00001 to 0.1 parts by mass and more preferably from 0.0001 to 0.01 parts by mass per total of 100 parts by mass of the straight-chain organopolysiloxane (A) and the branched-chain organopolysiloxane (B) described above.

Low-viscosity Organopolysiloxane (D)

The composition of the present technology preferably contains a low-viscosity organopolysiloxane (D) having a viscosity of at most 50,000 mPa·s at 25° C. The adhesion of the cured product to adherends is superior as a result of containing the low-viscosity organopolysiloxane (D). It is conceived that this is due to the fact that reducing the viscosity provides flexibility, which suppresses the occurrence of cracking and the like.

From the perspective of further improving the adhesion of the cured product, the viscosity of the low-viscosity organopolysiloxane (D) at 25° C. is preferably from 1,000 to 30,000 mPa·s.

The low-viscosity organopolysiloxane (D) is not particularly limited as long as it is an organopolysiloxane having a viscosity of at most 50,000 mPa·s at 25° C., but it is preferably a branched-chain organopolysiloxane having at least three alkenyl groups in one molecule.

A specific example of such a low-viscosity organopolysiloxane (D) is an organopolysiloxane represented by the following average unit formula (5).

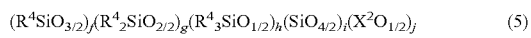
$(R^4SiO_{3/2})_f(R^4{}_2SiO_{2/2})_g(R^4{}_3SiO_{1/2})_h(SiO_{4/2})_i(X^2O_{1/2})_j$ (5)

In Formula (5), each $R^4$ moiety is independently a substituted or unsubstituted monovalent hydrocarbon group. Examples of this monovalent hydrocarbon group include alkyl groups having from 1 to 18 carbons such as methyl groups, ethyl groups, n-propyl groups, isopropyl groups, n-butyl groups, isobutyl groups, sec-butyl groups, tert-butyl groups, various pentyl groups, various hexyl groups, various octyl groups, various decyl groups, cyclopentyl groups, and cyclohexyl groups; alkenyl groups having from 2 to 18 carbons such as vinyl groups, allyl groups, butenyl groups, pentenyl groups, hexenyl groups, and octenyl groups; aryl groups having from 6 to 18 carbons such as phenyl groups, tolyl groups, and xylyl groups; aralkyl groups having from 7 to 18 carbons such as benzyl groups and phenethyl groups; and halogenated alkyl groups having from 1 to 18 carbons such as 3-chloropropyl groups and 3,3,3-trifluoropropyl groups.

However, it is preferable for at least three of the $R^4$ moieties in one molecule to be alkenyl groups. Furthermore, in one molecule, 10 mol % or greater but less than 40 mol % of all the $R^4$ moieties is preferably aryl groups.

In Formula (5), $X^2$ is a hydrogen atom or an alkyl group. Examples of this alkyl group include alkyl groups having from 1 to 18 carbons such as methyl groups, ethyl groups, n-propyl groups, isopropyl groups, n-butyl groups, isobutyl groups, sec-butyl groups, tert-butyl groups, various pentyl groups, various hexyl groups, various octyl groups, various decyl groups, cyclopentyl groups, and cyclohexyl groups, and methyl groups are preferable.

In Formula (5), f is a positive number; g is 0 or a positive number; h is 0 or a positive number; i is 0 or a positive number; j is 0 or a positive number; g/f is a number in a range of 0 to 10; h/f is a number exceeding 0.50 but 5 or less; i/(f+g+h+i) is a number in a range of 0 to 0.3; and j/(f+g+h+i) is a number in a range of 0 to 0.4.

The weight average molecular weight (Mw) of the low-viscosity organopolysiloxane (D) is preferably from 500 to 50,000 and more preferably from 1,000 to 30,000.

Furthermore, the content of the low-viscosity organopolysiloxane (D), which is an optional component, is not particularly limited but, for example, is preferably from 5 to 50 parts by mass and more preferably from 10 to 30 parts by mass per 100 parts by mass total of the straight-chain organopolysiloxane (A) and the branched-chain organopolysiloxane (B) described above.

Curing Retarder (E)

The composition of the present technology may further contain a curing retarder (E). The curing retarder (E) is a component for adjusting the curing speed or the working life of the composition of the present technology, and examples include alcohol derivatives containing carbon-carbon triple bonds such as 3-methyl-1-butyn-3-ol, 3,5-dimethyl-1-hexyn-3-ol, phenylbutynol, and 1-ethynyl-1-cyclohexanol; enyne compounds such as 3-methyl-3-penten-1-yne and 3,5-dimethyl-3-hexen-1-yne; alkenyl group-containing low molecular weight siloxanes such as tetramethyltetravinylcyclotetrasiloxane and tetramethyltetrahexenylcyclotetrasiloxane; and alkyne-containing silanes such as methyl-tris(3-methyl-1-butyn-3-oxy)silane and vinyl-tris(3-methyl-1-butyn-3-oxy)silane. One type of these retarders may be used alone, or two or more types may be used in combination.

The content of the curing retarder (E), which is an optional component, is selected appropriately in accordance with the usage method or the like of the composition of the present technology but is, for example, preferably from 0.00001 to 0.1 parts by mass and more preferably from 0.0001 to 0.01 parts by mass per 100 parts by mass total of the straight-chain organopolysiloxane (A) and the branched-chain organopolysiloxane (B) described above.

Adhesion Imparting Agent (F)

The composition of the present technology may further contain an adhesion imparting agent (F).

An example of the adhesion imparting agent (F) is a silane coupling agent. Specific examples of silane coupling agents include aminosilanes, vinyl silanes, epoxy silanes, methacrylic silanes, isocyanate silanes, iminosilanes, reaction products thereof, and compounds obtained by reactions between these substances and polyisocyanate, and epoxy silanes are preferable.

The epoxy silane is not particularly limited as long as it is a compound having an epoxy group and an alkoxysilyl group, and examples include dialkoxyepoxysilanes such as γ-glycidoxypropyl methyl dimethoxysilane, γ-glycidoxypropyl ethyl diethoxysilane, γ-glycidoxypropyl methyl diethoxysilane, and β-(3,4-epoxycyclohexyl)ethylmethyldimethoxysilane; and trialkoxyepoxysilanes such as γ-glycidoxypropyl trimethoxysilane and β-(3,4-epoxycyclohexyl)ethyltrimethoxysilane.

In addition, the adhesion imparting agent (F) may be a dehydration condensation product of the epoxy silane described above, examples of which include epoxy silane dehydration condensation productions formed by performing dehydration condensation on γ-glycidoxypropyl trimethoxysilane, phenyltrimethoxysilane, and 1,3-divinyl-1,1,3,3-tetramethyldisiloxane.

The content of the adhesion imparting agent (F), which is an optional constituent, is not particularly limited but is preferably from 0.5 to 10 parts by mass and more preferably from 1 to 5 parts by mass per 100 parts by mass total of the straight-chain organopolysiloxane (A) and the branched-chain organopolysiloxane (B) described above.

Straight-chain Organopolysiloxane (G)

The composition of the present technology may further contain, separate from the straight-chain organopolysiloxane (A) described above, a straight-chain organopolysiloxane (G) represented by the following Formula (6).

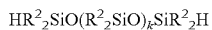
$HR^2{}_2SiO(R^2{}_2SiO)_kSiR^2{}_2H$ (6)

In Formula (6), each R² moiety is independently an alkyl group, aryl group, hydroxy group (-OH), or alkoxy group, and at least one of the R² moieties is an aryl group.

Examples of the alkyl groups of R² include alkyl groups having from 1 to 18 carbons such as methyl groups, ethyl groups, n-propyl groups, isopropyl groups, n-butyl groups, isobutyl groups, sec-butyl groups, tert-butyl groups, various pentyl groups, various hexyl groups, various octyl groups, various decyl groups, cyclopentyl groups, and cyclohexyl groups, and methyl groups are preferable.

Examples of the aryl groups of R² include aryl groups having from 6 to 18 carbons such as phenyl groups, tolyl groups, and xylyl groups, and phenyl groups are preferable.

Examples of the alkoxy groups of R² include methoxy groups, ethoxy groups, propoxy groups, and butoxy groups, and methoxy groups are preferable.

In Formula (6), k is a positive number of 1 to 5 as an average value, and a positive number of 1 to 3 is preferable.

The foldability of the composition of the present technology can be enhanced by allowing the straight-chain organopolysiloxane (G) having an average degree of polymerization of 1 to 5 to be contained. This may be due to the fact that the structure of the composition of the present technology does not become too dense. From the perspective of ensuring that the foldability can be better improved, an organopolysiloxane represented by the following Formula (7) is preferable as the straight-chain organopolysiloxane (G).

HMe₂SiO(Ph₂SiO)ₖSiMe₂H    (7)

In Formula (6), k is synonymous with k described above.

The content of the straight-chain organopolysiloxane (G) is not particularly limited but is preferably an amount at which the "Si—H/Si-Vi molar ratio" described above is within the range described above.

The composition of the present technology may further contain additives, such as a UV absorbent, filler (in particular, silica), anti-aging agent, antistatic agent, flame retardant, adhesion imparting agent, dispersant, antioxidant, antifoaming agent, matting agent, photostabilizer, dye, and pigment, in a range that does not impair the object of the present technology.

Among these additives, use of silica as the filler is preferable.

Note that type of the silica is not particularly limited, and examples thereof include wet silica (hydrous silicic acid), dry silica (silicic anhydride), calcium silicate, and aluminum silicate.

The production method of the composition of the present technology is not particularly limited, and an example is a method of producing the composition by mixing the essential components and optional components described above.

In addition, the method of obtaining a cured product by curing the composition of the present technology is also not particularly limited, and an example is a method of heating the composition of the present technology for 10 to 720 minutes at 80 to 200° C.

The composition of the present technology may be used as an adhesive, a primer, a sealant, or the like in fields such as, for example, display materials, optical recording media materials, optical device materials, optical part materials, optical fiber materials, optical-electronic function organic materials, and semiconductor integrated circuit peripheral materials.

In particular, the composition of the present technology can be suitably used as a sealing material for an optical semiconductor since it has excellent adhesion and the cured product thereof demonstrates good transparency and a high refractive index.

The optical semiconductors to which the composition of the present technology can be applied are not particularly limited, and examples include light-emitting diodes (LED), organic electroluminescent elements (organic EL), laser diodes, and LED arrays.

Examples of methods of using the composition of the present technology as a composition for sealing an optical semiconductor include applying the composition of the present technology to an optical semiconductor, heating the optical semiconductor to which the composition of the present technology has been applied, and curing the composition of the present technology.

At this time, the method of applying and curing the composition of the present technology is not particularly limited, and examples include a method using a dispenser, a potting method, screen printing, transfer molding, and injection molding.

EXAMPLES

The present technology will be described in detail hereinafter using working examples, but the present technology is not limited to these examples.

Production of Si—H-based Organopolysiloxane

Straight-chain Organopolysiloxane A1

In a flask equipped with a stirrer and a reflux condenser, 100 g of a straight-chain organopolysiloxane that had silanol groups and that was represented by Formula (8) below and 0.1 g of trifluoromethanesulfonic acid were loaded, stirred, and heated at 70° C. When the polymer reached the target viscosity, 100 g of toluene was added, and acid was removed by washing with water to obtain a polymer having both terminals capped with silanol represented by Formula (9) below. To this polymer, 10 g of 1,1,3,3-tetramethyldisiloxane and 0.1 g of trifluoromethanesulfonic acid were added, stirred, and heated at 60° C. for 2 hours. Next, 150 g of toluene was added, and the water that was produced was discharged to the outside of the system. After the toluene layer was washed with water three times, the layer was concentrated under reduced pressure to obtain a straight-chain organopolysiloxane A1 represented by the following Formula (10).

HO(MePhSiO)₆H    (8)

HO(MePhSiO)₅₀H    (9)

HMe₂SiO(MePhSiO)₅₀SiMe₂H    (10)

Straight-chain Organopolysiloxane A2

A straight-chain organopolysiloxane A2 represented by Formula (11) below was obtained in the same manner as described above except for changing the target viscosity during the dehydration condensation of the straight-chain organopolysiloxane that had silanol groups and that was represented by Formula (8) above.

HMe₂SiO(MePhSiO)₁₈₀SiMe₂H    (11)

Straight-chain Organopolysiloxane A3

A straight-chain organopolysiloxane A3 represented by Formula (12) below was obtained in the same manner as described above except for changing the target viscosity during the dehydration condensation of the straight-chain organopolysiloxane that had silanol groups and that was represented by Formula (8) above.

HMe₂SiO(MePhSiO)₇₀SiMe₂H    (12)

Straight-chain Organopolysiloxane A4

In a flask equipped with a stirrer and a reflux condenser, 200 g of toluene, 500 g of dichloromethylphenylsilane, and 3.5 g of 1,1,3,3-tetramethyldisiloxane were loaded. While the mixture was being stirred, 100 g of water was added dropwise over 1 hour, and after the completion of the addition, the mixture was heated and refluxed at 50° C. for 5 hours. After the solution was cooled to room temperature, toluene was added, mixed, and left to stand. The bottom layer (water layer) was separated, and the toluene solution layer was washed with water three times. The remaining toluene solution layer was concentrated under reduced pressure to obtain a straight-chain organopolysiloxane A4 represented by Formula (13) below.

HMe$_2$SiO(MePhSiO)$_{100}$SiMe$_2$H (13)

Straight-chain Organopolysiloxane G1

In a flask equipped with a stirrer and a reflux condenser, 100 g of dichlorodiphenylsilane and 107 g of chlorodimethylsilane (HMe$_2$SiCl) were loaded. While the mixture was being stirred, 30 g of water was added dropwise over 1 hour, and after the completion of the addition, the mixture was heated and refluxed at 50° C. for 5 hours. After the solution was cooled to room temperature, toluene was added, mixed, and left to stand. The bottom layer (water layer) was separated, and the toluene solution layer was washed with water three times. The remaining toluene solution layer was concentrated under reduced pressure to obtain a straight-chain organopolysiloxane G1 represented by the following Formula (14).

HMe$_2$SiO(Ph$_2$SiO)SiMe$_2$H (14)

Straight-chain Organopolysiloxane G2

In a flask equipped with a stirrer and a reflux condenser, 100 g of dichlorodiphenylsilane and 60 g of chlorodimethylsilane were loaded. While the mixture was being stirred, 30 g of water was added dropwise over 1 hour, and after the completion of the addition, the mixture was heated and refluxed at 50° C. for 5 hours. After the solution was cooled to room temperature, toluene was added, mixed, and left to stand. The bottom layer (water layer) was separated, and the toluene solution layer was washed with water three times. The remaining toluene solution layer was concentrated under reduced pressure to obtain a straight-chain organopolysiloxane G2 represented by the following Formula (15).

HMe$_2$SiO(Ph$_2$SiO)$_{2.1}$SiMe$_2$H (15)

Straight-chain Organopolysiloxane G3

In a flask equipped with a stirrer and a reflux condenser, 100 g of dichloromethylphenylsilane and 85 g of chlorodimethylsilane were loaded. While the mixture was being stirred, 30 g of water was added dropwise over 1 hour, and after the completion of the addition, the mixture was heated and refluxed at 50° C. for 5 hours. After the solution was cooled to room temperature, toluene was added, mixed, and left to stand. The bottom layer (water layer) was separated, and the toluene solution layer was washed with water three times. The remaining toluene solution layer was concentrated under reduced pressure to obtain a straight-chain organopolysiloxane G3 represented by Formula (16) below.

HMe$_2$SiO(MePhSiO)SiMe$_2$H (16)

Production of Si-Vi-based Organopolysiloxane
Branched-chain Organopolysiloxane B1

First, 21.4 g of 1,3-divinyl-1,1,3,3-tetramethyldisiloxane, 60 g of water, 0.14 g of trifluoromethanesulfonic acid, and 200 g of toluene were charged into a four-neck flask with a stirrer, a reflux condenser, a charging port, and a thermometer and mixed, and 151.5 g of phenyltrimethoxysilane was added dropwise into the solution while stirring over the course of 1 hour. After addition was complete, the solution was heat-refluxed for 1 hour. After cooling, the bottom layer was separated, and the toluene solution layer was washed with water three times. Next, 100 g of a 5% of sodium hydrogen carbonate aqueous solution was added to the water-washed toluene solution layer, and the solution was heated to 75° C. while stirring and then refluxed for 1 hour. After cooling, the bottom layer was separated, and the toluene solution layer of the top layer was washed with water three times. The remaining toluene solution layer was concentrated under reduced pressure to obtain a branched-chain organopolysiloxane B1, which is a methylphenylvinylpolysiloxane resin represented by the following average unit formula (17) and is in a semi-solid state at 25° C.

(ViMe$_2$SiO$_{1/2}$)$_{0.22}$(PhSiO$_{3/2}$)$_{0.78}$ (17)

Straight-chain Organopolysiloxane X1

In a flask equipped with a stirrer and a reflux condenser, 100 g of a straight-chain organopolysiloxane that had silanol groups and that was represented by Formula (18) below, 60 g of 1,3-divinyltetramethyldisiloxane, and 0.1 g of trifluoromethanesulfonic acid were loaded, stirred, and heated at 70° C. for 2 hours. Thereafter, toluene was added. After the toluene layer was washed with water three times, the solution was concentrated under reduced pressure to obtain a straight-chain organopolysiloxane X1 represented by Formula (19) below.

HO(MePhSiO)$_{10}$H (18)

ViMe$_2$SiO(MePhSiO)$_{10}$SiViMe$_2$ (19)

Working Examples 1 to 6 and Comparative Examples 1 to 3

Production of Curable Resin Composition

The components shown in Table 1 below were used in the amounts shown in the table (units: parts by mass), and these components were mixed uniformly with a vacuum stirrer to produce a curable resin composition (simply called a "composition" hereafter). In this table, the "Si—H/Si-Vi molar ratio" is as described above.

Transmittance

The produced composition was cured by heating for 2 hours at 150° C. to obtain a cured product (thickness=2.0 mm). The transmittance at a wavelength of 400 nm (unit: %) was measured for the obtained cured product in accordance with JIS K 0115:2004 using an ultraviolet-visible (UV-Vis) absorption spectrometer (manufactured by Shimadzu Corporation). The measurement results are shown in Table 1 below. The composition can be evaluated as having excellent "transparency" when the transmittance value is 80% or greater.

Adhesive Properties

The produced compositions were coated on various substrates shown in Table 1 below (polyphthalamide-based package (size: 5 mm×5 mm, depth: 1 mm), epoxy-based package (size: diameter: 3 mm, depth: 0.5 mm), polycyclohexylene dimethylene terephthalate (PCT)-based package (size: 5 mm×5 mm, depth: 1.3 mm), and ceramic-based package (size: diameter: 5 mm, depth: 0.7 mm)) and heated at 150° C. for 2 hours to cure, thereby producing test samples.

Fifty test samples were produced for each example. The 50 test samples that were produced were used in the following two types of tests, and the number of test samples in which the peeling of the cured product was not observed were counted. Greater number of the test samples in which the peeling of the cured product was not observed is evaluated as having superior adhesive properties. When the number of the test samples in which peeling was not observed was 30 or greater, the test samples were at a level that practically had no problems.

Heat Shock Test

After the test sample was left to stand for 30 minutes in an environment at −40° C., the test sample was placed on a hot plate heated to 100° C. for 30 minutes. This process was repeated for 500 times, and then presence or absence of the peeling of the cured product was visually confirmed.

Moisture Resistance Reflow Test

Moisture reflow test equivalent to moisture sensitivity level (MSL) 3 was performed. That is, after the test sample was left to stand for 40 hours in an environment with a temperature of 60° C. and a humidity of 60% so that the test sample absorbed enough moisture, the test sample was passed through an IR reflow oven at 260° C. for three times (approximately 6 minutes for one passing). Thereafter, presence or absence of the peeling of the cured product was visually confirmed.

TABLE 1

| Table 1-1 | | | Working Examples | | | | | |
|---|---|---|---|---|---|---|---|---|
| | | | 1 | 2 | 3 | 4 | 5 | 6 |
| Si-H-based | | Straight-chain organopolysiloxane A1 | 100 | 100 | | | | |
| | | Straight-chain organopolysiloxane A2 | | | 100 | | | |
| | | Straight-chain organopolysiloxane A3 | | | | 100 | | |
| | | Straight-chain organopolysiloxane A4 | | | | | 100 | 100 |
| | | Straight-chain organopolysiloxane G1 | | 44 | | | | 44 |
| | | Straight-chain organopolysiloxane G2 | 150 | 71 | 150 | 160 | 130 | 71 |
| | | Straight-chain organopolysiloxane G3 | | | | | | |
| Si-Vi-based | | Branched-chain organopolysiloxane B1 | 200 | 200 | 200 | 200 | 200 | 200 |
| | | Straight-chain organopolysiloxane X1 | | | | | | |
| | Hydrosilylation reaction catalyst C1 | | 0.1 | 0.1 | 0.1 | 0.1 | 0.1 | 0.1 |
| | Low-viscosity organopolysiloxane D1 | | 85 | 85 | 80 | 90 | 85 | 85 |
| | Curing retarder E1 | | 0.1 | 0.1 | 0.1 | 0.1 | 0.1 | 0.1 |
| | Adhesion imparting agent F1 | | 1.0 | 1.0 | 1.0 | 1.0 | 1.0 | 1.0 |
| | Si-H/Si-Vi molar ratio | | 0.90 | 0.90 | 0.90 | 0.90 | 0.90 | 0.90 |
| | Diphenyldisiloxane units in all siloxane units (mol %) | | 13.3 | 16.1 | 12.5 | 13.4 | 13.3 | 16.2 |
| | Content of cyclic organosiloxane (mass %) | | 1.3 | 2.4 | 2.3 | 2.3 | 9.7 | 10.0 |
| | Transmittance [%] | | 89.0 | 88.0 | 88.0 | 88.0 | 88.0 | 88.0 |
| Substrate | Polyphthalamide-based | Heat shock test −40° C. 30 min ⇔ 100° C. 30 min | 50/50 | 50/50 | 50/50 | 50/50 | 50/50 | 50/50 |
| | Epoxy-based | | 50/50 | 50/50 | 50/50 | 50/50 | 41/50 | 30/50 |
| | PCT-based | | 50/50 | 50/50 | 50/50 | 50/50 | 43/50 | 37/50 |
| | Ceramic-based | | 50/50 | 50/50 | 50/50 | 50/50 | 45/50 | 33/50 |
| | Polyamide-based | Moisture reflow test 60° C. 60% 40 hrs | 50/50 | 50/50 | 50/50 | 50/50 | 50/50 | 50/50 |
| | Epoxy-based | | 50/50 | 50/50 | 50/50 | 50/50 | 35/50 | 35/50 |
| | PCT-based | | 50/50 | 50/50 | 50/50 | 50/50 | 37/50 | 30/50 |
| | Ceramic-based | | 50/50 | 50/50 | 50/50 | 50/50 | 40/50 | 38/50 |

| Table 1-2 | | Comparative Examples | | |
|---|---|---|---|---|
| | | 1 | 2 | 3 |
| Si-H-based | Straight-chain organopolysiloxane A1 | | | 100 |
| | Straight-chain organopolysiloxane A2 | | | |
| | Straight-chain organopolysiloxane A3 | | | |
| | Straight-chain organopolysiloxane A4 | | | |
| | Straight-chain organopolysiloxane G1 | | 25 | |
| | Straight-chain organopolysiloxane G2 | | | |
| | Straight-chain organopolysiloxane G3 | 20 | | 44 |

TABLE 1-continued

| | | | | |
|---|---|---|---|---|
| Si-Vi-based | Branched-chain organopolysiloxane B1 | 70 | 70 | 200 |
| | Straight-chain organopolysiloxane X1 | 30 | 30 | |
| | Hydrosilylation reaction catalyst C1 | 0.1 | 0.1 | 0.1 |
| | Low-viscosity organopolysiloxane D1 | | | 85 |
| | Curing retarder E1 | 0.1 | 0.1 | 0.1 |
| | Adhesion imparting agent F1 | 1.0 | 1.0 | 1.0 |
| | Si-H/Si-Vi molar ratio | 0.90 | 0.90 | 0.90 |
| Diphenyldisiloxane units in all siloxane units (mol %) | | 0.0 | 8.0 | 0.0 |
| Content of cyclic organosiloxane (mass %) | | 0.0 | 0.0 | 1.6 |
| Transmittance [%] | | 88.0 | 88.0 | 88.0 |
| Substrate | Polyphthalamide-based | Heat shock test −40° C. 30 min ⇔ 100° C. 30 min | 45/50 | 12/50 | 40/50 |
| | Epoxy-based | | 17/50 | 7/50 | 31/50 |
| | PCT-based | | 15/50 | 5/50 | 20/50 |
| | Ceramic-based | | 18/50 | 8/50 | 25/50 |
| | Polyamide-based | Moisture reflow test 60° C. 60% 40 hrs | 35/50 | 5/50 | 32/50 |
| | Epoxy-based | | 12/50 | 2/50 | 25/50 |
| | PCT-based | | 10/50 | 8/50 | 17/50 |
| | Ceramic-based | | 20/50 | 20/50 | 23/50 |

The components shown in Table 1 are as follows.

Si—H-Based

Straight-chain organopolysiloxane A1: as described above (silicon-bonded hydrogen atom content: 0.04 mass %; content ratio of phenyl groups in all silicon-bonded organic groups: 48 mol %; Mw: 6,500; viscosity: 7,000 mPa·s)

Straight-chain organopolysiloxane A2: as described above (silicon-bonded hydrogen atom content: 0.01 mass %; content ratio of phenyl groups in all silicon-bonded organic groups: 49 mol %; Mw: 25,000; viscosity: 40,000 mPa·s)

Straight-chain organopolysiloxane A3: as described above (silicon-bonded hydrogen atom content: 0.02 mass %; content ratio of phenyl groups in all silicon-bonded organic groups: 49 mol %; Mw: 10,000; viscosity: 12,000 mPa·s)

Straight-chain organopolysiloxane A4: as described above (silicon-bonded hydrogen atom content: 0.02 mass %; content ratio of phenyl groups in all silicon-bonded organic groups: 49 mol %; Mw: 20,000; viscosity: 13,000 mPa·s)

Straight-chain organopolysiloxane G1: as described above (silicon-bonded hydrogen atom content: 0.60 mass %; content ratio of phenyl groups in all silicon-bonded organic groups: 33 mol %)

Straight-chain organopolysiloxane G2: as described above (silicon-bonded hydrogen atom content: 0.35 mass %; content ratio of phenyl groups in all silicon-bonded organic groups: 52 mol %)

Straight-chain organopolysiloxane G3: as described above (silicon-bonded hydrogen atom content: 0.74 mass %; content ratio of phenyl groups in all silicon-bonded organic groups: 17 mol %) Si-Vi-based Branched-chain organopolysiloxane B1: as described above (vinyl group content: 5.0 mass %; content ratio of phenyl groups in all silicon-bonded organic groups: 54 mol %; Mw: 1,500; viscosity: the substance was an extremely viscous semi-solid material and the viscosity could not be measured)

Straight-chain organopolysiloxane X1: as described above (vinyl group content: 3.5 mass %; content ratio of phenyl groups in all silicon-bonded organic groups: 50 mol %; Mw: 1,500; viscosity: 200 mPa·s)

Hydrosilylation reaction catalyst C1: platinum divinyltetramethyldisiloxane complex (trade name: 3% Pt-VTS-VTS, manufactured by N. E. Chemcat)

Low-viscosity, branched-chain organopolysiloxane D1: organopolysiloxane represented by the following average unit formula (20) (vinyl group content: 8.8 mass %; content ratio of phenyl groups in all silicon-bonded organic groups: 36 mol %; Mw: 1,100; viscosity: 15,000 mPa·s)

$$(PhSiO_{3/2})_{0.63}(ViMe_2SiO_{1/2})_{0.37} \qquad (20)$$

Curing retarder E1: 3-methyl-1-butyne-3-ol (manufactured by Tokyo Kasei Kogyo Co., Ltd.)

Adhesion imparting agent F1: epoxy silane dehydration condensation product formed by performing dehydration condensation on γ-glycidoxypropyl trimethoxysilane (KBM-403 manufactured by Shin-Etsu Chemical Co., Ltd.), phenyltrimethoxysilane (KBM-103 manufactured by Shin-Etsu Chemical Co., Ltd.), and 1,3-divinyl-1,1,3,3-tetramethyldisiloxane As is clear from the results shown in Table 1, it was found that Comparative Examples 1 and 2 which contained only the straight-chain organopolysiloxane (G) with the degree of polymerization of 1, although it was a Si—H-based straight-chain organopolysiloxane, exhibited poor adhesive properties depending on the type of the substrate.

Furthermore, it was also found that Comparative Example 3 in which the proportion of the diphenylsiloxane units in all the siloxane units was less than 10 mol %, although Comparative Example 3 contained the Si—H-based straight-chain organopolysiloxane and the Si—V-based branched-chain organopolysiloxane, exhibited poor adhesive properties depending on the type of the substrate.

On the other hand, it was found that the curable resin compositions of Working Examples 1 to 6, in which the Si—H-based straight-chain organopolysiloxane and the Si—V-based branched-chain organopolysiloxane were contained and the proportion of the diphenylsiloxane units in all the siloxane units was 10 mol % or greater, exhibited excellent adhesion to all the substrates after the curing.

In particular, it was found that the curable resin compositions of Working Examples 1 to 4, in which the content (mass %) of the cyclic organosiloxane was less than 7.5 mass %, further enhanced the adhesion to all the substrates after the curing.

The invention claimed is:

1. A curable resin composition comprising:
   (A) a straight-chain organopolysiloxane having at least two silicon-bonded hydrogen atoms and at least one aryl group in one molecule and having an average degree of polymerization of greater than 10;
   (B) a branched-chain organopolysiloxane having at least three alkenyl groups and at least one aryl group in one molecule; and
   (C) a hydrosilylation reaction catalyst;
   wherein a proportion of diphenylsiloxane units relative to an amount of all siloxane units is 10 mol % or greater, and the all siloxane units containing siloxane units derived from the straight-chain organopolysiloxane (A) and the branched-chain organopolysiloxane (B);
   the curable resin composition further comprising a straight-chain organopolysiloxane (G) represented by formula (6) below:

$$HR^2_2SiO(R^2_2SiO)_kSiR^2_2H \qquad (6)$$

wherein, each $R^2$ moiety is independently an alkyl group, aryl group, hydroxy group, or alkoxy group, and at least one of the $R^2$ moieties is an aryl group; and
   k is a positive number of 1 to 5.

2. The curable resin composition according to claim 1, wherein a content of a cyclic organosiloxane having a molecular weight of 150 to 1,200 is 7.5 mass % or less.

3. The curable resin composition according to claim 1, wherein the average degree of polymerization of the straight-chain organopolysiloxane (A) is greater than 30.

4. The curable resin composition according to claim 1, wherein the branched-chain organopolysiloxane (B) is an organopolysiloxane represented by average unit formula (4) below:

$$(R^3SiO_{3/2})_a(R^3_2SiO_{2/2})_b(R^3_3SiO_{1/2})_c(SiO_{4/2})_d(X^1O_{1/2})_e \qquad (4)$$

wherein, each $R^3$ moiety is independently a substituted or unsubstituted monovalent hydrocarbon group; however, in one molecule, at least three of the $R^3$ moieties are alkenyl groups, and at least one $R^3$ moiety is an aryl group;
   $X^1$ is a hydrogen atom or alkyl group;
   a is a positive number; b is 0 or a positive number; c is 0 or a positive number; d is 0 or a positive number; e is 0 or a positive number; b/a is a number in a range of 0 to 10; c/a is a number in a range of 0 to 0.50; d/(a+b+c+d) is a number in a range of 0 to 0.3; and e/(a+b+c+d) is a number in a range of 0 to 0.4.

5. The curable resin composition according to claim 1, wherein the composition is a composition for sealing an optical semiconductor element.

6. The curable resin composition according to claim 2, wherein the average degree of polymerization of the straight-chain organopolysiloxane (A) is greater than 30.

7. The curable resin composition according to claim 2, wherein the branched-chain organopolysiloxane (B) is an organopolysiloxane represented by average unit formula (4) below:

$$(R^3SiO_{3/2})_a(R^3_2SiO_{2/2})_b(R^3_3SiO_{1/2})_c(SiO_{4/2})_d(X^1O_{1/2})_e \qquad (4)$$

wherein, each $R^3$ moiety is independently a substituted or unsubstituted monovalent hydrocarbon group; however, in one molecule, at least three of the $R^3$ moieties are alkenyl groups, and at least one $R^3$ moiety is an aryl group;
   $X^1$ is a hydrogen atom or alkyl group;
   a is a positive number; b is 0 or a positive number; c is 0 or a positive number; d is 0 or a positive number; e is 0 or a positive number; b/a is a number in a range of 0 to 10; c/a is a number in a range of 0 to 0.50; d/(a+b+c+d) is a number in a range of 0 to 0.3; and e/(a+b +c+d) is a number in a range of 0 to 0.4.

8. The curable resin composition according to claim 3, wherein the branched-chain organopolysiloxane (B) is an organopolysiloxane represented by average unit formula (4) below:

$$(R^3SiO_{3/2})_a(R^3_2SiO_{2/2})_b(R^3_3SiO_{1/2})_c(SiO_{4/2})_d(X^1O_{1/2})_e \qquad (4)$$

wherein, each $R^3$ moiety is independently a substituted or unsubstituted monovalent hydrocarbon group; however, in one molecule, at least three of the $R^3$ moieties are alkenyl groups, and at least one $R^3$ moiety is an aryl group;
   $X^1$ is a hydrogen atom or alkyl group;
   a is a positive number; b is 0 or a positive number; c is 0 or a positive number; d is 0 or a positive number; e is 0 or a positive number; b/a is a number in a range of 0 to 10; c/a is a number in a range of 0 to 0.50; d/(a+b+c+d) is a number in a range of 0 to 0.3; and e/(a+b+c+d) is a number in a range of 0 to 0.4.

* * * * *